(12) United States Patent
Ikegami (10) Patent No.: US 10,611,147 B2
(45) Date of Patent: Apr. 7, 2020

(54) LIQUID DISCHARGE DEVICE AND LIQUID DISCHARGE APPARATUS

(71) Applicant: Kohtaroh Ikegami, Kanagawa (JP)

(72) Inventor: Kohtaroh Ikegami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/263,082

(22) Filed: Jan. 31, 2019

(65) Prior Publication Data

US 2019/0283409 A1 Sep. 19, 2019

(30) Foreign Application Priority Data

Mar. 19, 2018 (JP) ................................. 2018-050518

(51) Int. Cl.
*B41J 2/045* (2006.01)
*G01R 19/165* (2006.01)

(52) U.S. Cl.
CPC ......... *B41J 2/04588* (2013.01); *B41J 2/0457* (2013.01); *B41J 2/04555* (2013.01); *B41J 2/04581* (2013.01); *G01R 19/16528* (2013.01)

(58) Field of Classification Search
CPC .... B41J 2/0457; B41J 2/04555; B41J 2/0451; G01R 19/16528
See application file for complete search history.

(56) References Cited

U.S. PATENT DOCUMENTS

| 2011/0292107 A1* | 12/2011 | Yamashita | B41J 2/0451 |
| | | | 347/10 |
| 2012/0025845 A1* | 2/2012 | Carrobe | B41J 2/0451 |
| | | | 324/551 |
| 2012/0049632 A1* | 3/2012 | Sato | B41J 2/0451 |
| | | | 307/80 |

FOREIGN PATENT DOCUMENTS

| JP | 2009-136082 | 6/2009 |
| JP | 2012-250472 | 12/2012 |
| JP | 2017-019210 | 1/2017 |

* cited by examiner

*Primary Examiner* — Julian D Huffman
(74) *Attorney, Agent, or Firm* — Harness, Dickey & Pierce, P.L.C.

(57) ABSTRACT

A liquid discharge device includes a liquid discharge head to discharge liquid and circuitry configured to generate a drive waveform to drive the liquid discharge head. The circuitry converts, to an analog signal, drive waveform voltage data being a source of the drive waveform; amplifies in voltage the analog signal to generate a drive waveform voltage signal; amplifies in current the drive waveform voltage signal to generate the drive waveform; monitors the drive waveform to detect an abnormality of the drive waveform; controls an operation of the liquid discharge device based on a result of detection of the abnormality of the drive waveform; compares an output of the voltage amplifier and an output of the current amplifier to output a difference between the output of the voltage amplifier and the output of the current amplifier; and outputs a binarized signal based on the difference.

7 Claims, 10 Drawing Sheets

LIQUID DISCHARGE DEVICE AND LIQUID DISCHARGE APPARATUS

CROSS-REFERENCE TO RELATED APPLICATION

This patent application is based on and claims priority pursuant to 35 U.S.C. § 119(a) to Japanese Patent Application No. 2018-050518, filed on Mar. 19, 2018, in the Japan Patent Office, the entire disclosure of which is hereby incorporated by reference herein.

BACKGROUND

Technical Field

The present disclosure relates to a liquid discharge device and a liquid discharge apparatus.

Description of the Related Art

There are liquid discharge apparatuses configured to control the operation of a liquid discharge device having a liquid discharge head to discharge a proper amount of liquid to an object at an appropriate timing. An example of liquid discharge apparatus is an image forming apparatus to discharge liquid ink onto a recording medium, to form a text or an illustration on the recording medium.

The liquid discharge device includes, for example, a liquid discharge head employing a piezoelectric element (e.g., a piezo actuator) and a drive waveform generation circuit configured to generate a drive waveform (drive voltage) to be applied to the piezoelectric element. In such a liquid discharge device, the drive waveform generating circuit may be damaged by leakage of the liquid (ink) or the like in a portion of the head including the piezoelectric element (a piezo portion). Therefore, there are liquid discharge devices provided with a protector for the drive waveform generation circuit.

SUMMARY

According to an embodiment of this disclosure, a liquid discharge device includes a liquid discharge head configured to discharge liquid and circuitry configured to generate a drive waveform to drive the liquid discharge head. The circuitry is configured to convert, to an analog signal, drive waveform voltage data being a source of the drive waveform; amplify, with a voltage amplifier, the analog signal to generate a drive waveform voltage signal corresponding to the drive waveform voltage data; amplify, with a current amplifier, the drive waveform voltage signal to generate the drive waveform; monitor the drive waveform to detect an abnormality of the drive waveform; control an operation of the liquid discharge device based on a result of detection of the abnormality of the drive waveform; compare an output of the voltage amplifier and an output of the current amplifier to output a difference between the output of the voltage amplifier and the output of the current amplifier; and output a binarized signal based on the difference.

According to another embodiment, a liquid discharge apparatus includes the liquid discharge device described above.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

The accompanying drawings are intended to depict embodiments of the present invention and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

According to an aspect of the present disclosure, a liquid discharge device or liquid discharge apparatus includes a liquid discharge head employing a piezoelectric element, and an abnormality of the liquid discharge device is detected based on a drive voltage applied to the piezoelectric element and a drive voltage in a voltage amplification unit connected to an upstream side of the piezoelectric element.

According to an aspect of the present disclosure, a liquid discharge device or liquid discharge apparatus includes a liquid discharge head including a piezoelectric element, and an abnormality of the liquid discharge device is detected based on a drive voltage applied to the piezoelectric element and a drive voltage in a voltage amplification unit connected to an upstream side of the piezoelectric element. With this configuration, a controller can determine which of the liquid discharge head, the drive waveform generation circuit, and another portion of the liquid discharge device has an abnormality. An aspect of the present disclosure concerns identification of the portion having the abnormality in monitoring the operation of the liquid discharge device.

In the present disclosure, "liquid discharge apparatus" is an apparatus that includes a liquid discharge head or a liquid discharge device and drives the liquid discharge head to discharge liquid. The term "liquid discharge apparatus" used here includes, in addition to apparatuses to discharge liquid to materials to which the liquid can adhere, apparatuses to discharge the liquid into gas (air) or liquid.

The liquid discharge apparatus can include at least one of devices to feed, convey, and discharge the material to which liquid can adhere. The liquid discharge apparatus can further include at least one of a pretreatment apparatus and a post-processing apparatus.

As the liquid discharge apparatuses, for example, there are image forming apparatuses to discharge ink onto sheets to form images and three-dimensional fabricating apparatuses to discharge molding liquid to a powder layer in which powder is molded into a layer-like shape, so as to form three-dimensional fabricated objects.

The term "liquid discharge apparatus" is not limited to an apparatus to discharge liquid to visualize meaningful images, such as letters or figures. For example, the liquid discharge apparatus can be an apparatus to form meaningless images, such as meaningless patterns, or fabricate meaningless three-dimensional images.

The term "liquid discharge device" represents a unit in which the liquid discharge head and other functional parts or mechanisms are combined, in other words, an assembly of parts relating to the liquid discharge function. For example, the liquid discharge device (a liquid discharge unit) includes a combination of the head with at least one of a head tank, a carriage, a supply device, a maintenance device, and a main scan moving unit.

The term "liquid discharge head" used herein represents a functional component to discharge or jet liquid from nozzles. The liquid to be discharged from the nozzle of the liquid discharge head is not limited to a particular liquid as long as the liquid has a viscosity or surface tension to be discharged from the liquid discharge head. However, preferably, the viscosity of the liquid is not greater than 30 mPa·s under ordinary temperature and ordinary pressure or by heating or cooling. Examples of the liquid include a solution, a suspension, or an emulsion including, for example, a solvent, such as water or an organic solvent, a colorant, such as dye or pigment, a functional material, such as a polymerizable compound, a resin, a surfactant, a biocompatible material, such as DNA, amino acid, protein, or calcium, and an edible material, such as a natural colorant. Such a solution, a suspension, or an emulsion can be used for, e.g., inkjet ink, surface treatment liquid, a liquid for forming components of electronic element or light-emitting element or a resist pattern of electronic circuit, or a material solution for three-dimensional fabrication. Examples of an energy source for generating energy to discharge liquid include a piezoelectric actuator (a laminated piezoelectric element or a thin-film piezoelectric element), a thermal actuator that employs a electrothermal transducer element, such as a heat element, and an electrostatic actuator including a diaphragm and opposed electrodes.

The above-mentioned term "material to which liquid can adhere" represents a material which liquid can, at least temporarily, adhere to and solidify thereon, or a material into which liquid permeates. Examples of "material to which liquid can adhere" include paper sheets, recording media such as recording sheet, recording sheets, film, and cloth; electronic components such as electronic substrates and piezoelectric elements; and media such as powder layers, organ models, and testing cells. The term "material to which liquid can adhere" includes any material to which liquid adheres, unless particularly limited.

The above-mentioned "material to which liquid adheres" can be any material, such as paper, thread, fiber, cloth, leather, metal, plastic, glass, wood, ceramics, or the like, as long as liquid can temporarily adhere.

Further, "liquid" is not particularly limited as long as the liquid has a viscosity and surface tension of degrees dischargeable from the liquid discharge head. As described above, preferable, "liquid" has a viscosity of 30 mPa·s or lower under ordinary temperature and ordinary pressure or by heating and cooling.

The "liquid discharge apparatus" can be an apparatus in which the liquid discharge head and a material to which liquid can adhere move relatively to each other. However, the liquid discharge apparatus is not limited to such an apparatus. For example, the liquid discharge apparatus can be a serial head apparatus that moves the liquid discharge head or a line head apparatus that does not move the liquid discharge head.

Examples of the "liquid discharge apparatus" further include a treatment liquid coating apparatus to discharge a treatment liquid to a sheet to coat a sheet surface with the treatment liquid to reform the sheet surface and an injection granulation apparatus in which a composition liquid including raw materials dispersed in a solution is discharged through nozzles to granulate fine particles of the raw materials.

Referring now to the drawings, wherein like reference numerals designate identical or corresponding parts throughout the several views thereof, a liquid discharge apparatus according to an embodiment of this disclosure is described. As used herein, the singular forms "a", "an", and "the" are intended to include the plural forms as well, unless the context clearly indicates otherwise.

The suffixes y, m, c, and k attached to each reference numeral indicate only that components indicated thereby are used for forming yellow, magenta, cyan, and black images, respectively, and hereinafter may be omitted when color discrimination is not necessary.

Figure 1A:
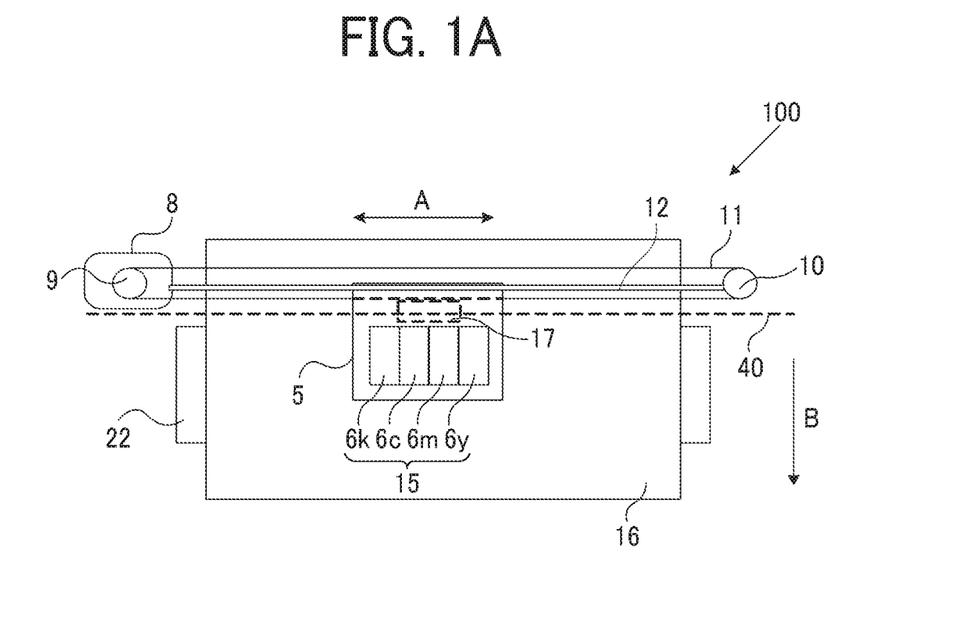
FIGS. 1A and 1B are schematic views illustrating a configuration of a liquid discharge device according to an embodiment of the present disclosure.
Figure 1B:
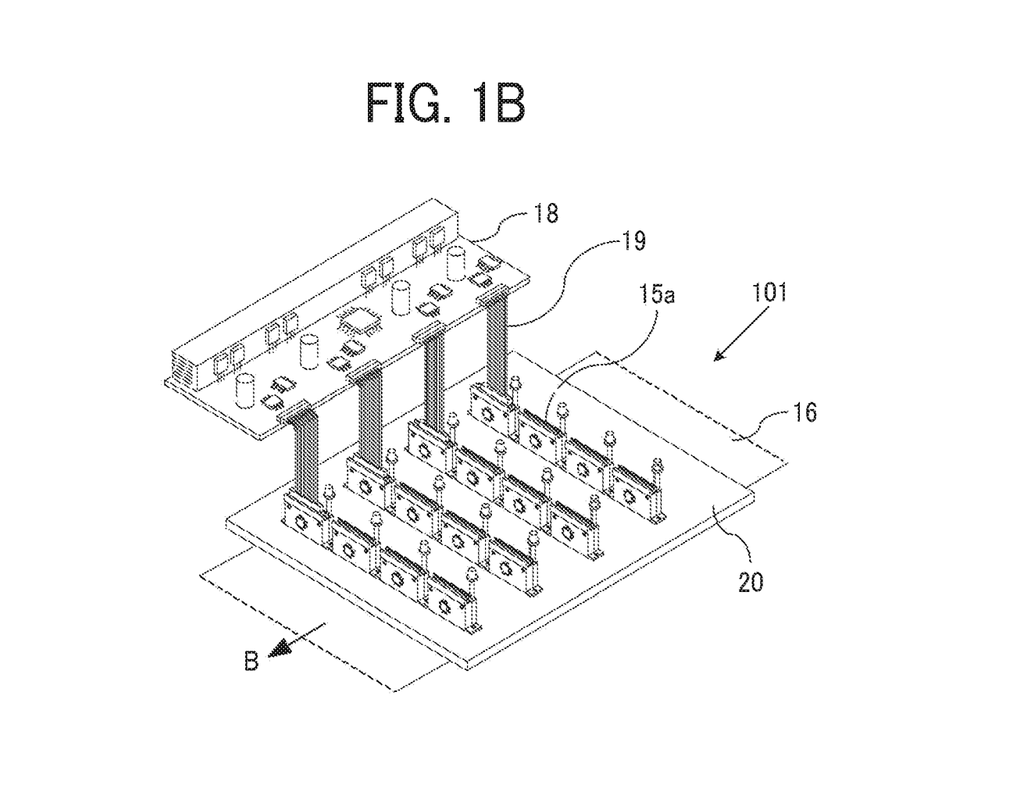

An inkjet recording apparatus illustrated in FIG. 1 is a liquid discharge apparatus according to an embodiment of the present embodiment and includes a liquid discharge device according to the present embodiment.

Liquid Discharge Device

FIG. 1A is a plan view schematically illustrating a configuration of a serial-head inkjet recording unit 100 as one example of liquid discharging devices according to the present disclosure.

As illustrated in FIG. 1A, the inkjet recording unit 100 includes a carriage 5, a main scanning motor 8, a gear 9, a pressure roller 10, a timing belt 11, a guide rod 12, and a platen 22.

In the carriage 5, a head 15 is mounted. The head 15 is an example of a liquid discharge head to discharge liquid such as ink. The head 15 includes a plurality of ink discharge mechanisms respectively for a plurality of different color inks. The head 15 illustrated in FIG. 1 includes a yellow liquid discharge mechanism 6y to discharge yellow (y) ink, a cyan liquid discharge mechanism 6c to discharge cyan (c) ink, a magenta liquid discharge mechanism 6m to discharge magenta (m), and a black liquid discharge mechanism 6k to discharge black (k). The inkjet recording unit 100 is applicable to formation of a color image.

The operation of the inkjet recording unit 100 will be described. The driving force of the main scanning motor 8 is transmitted to the carriage 5 through the gear 9, the pressure roller 10, and the timing belt 11. The carriage 5 is attached to the guide rod 12 to slide in the main scanning direction. Thus, the carriage 5 is configured to reciprocate in the main scanning direction with the driving force of the main scanning motor 8. The main scanning direction refers to the direction indicated by arrow A in FIG. 1A.

The platen 22 is a part of a medium conveyance unit to convey a recording medium (e.g., a medium 16) onto which the liquid ink is discharged from the head 15. The medium 16 is a sheet and is generally a sheet of paper (plain paper). In the present embodiment, the medium 16 is not limited to paper (plain paper) but can be a sheet-like material such as coated paper, thick paper, an overhead projector (OHP) sheet, plastic film, prepreg, a plate-like building material, copper foil, and the like. Further, the thickness of the medium 16 is much smaller than the distance from the head 15 to the platen 22.

The carriage 5 is provided with an encoder 17. As the encoder 17 reads an encoder sheet 40 provided along the direction of movement of the carriage 5 (main scanning direction), the position of the carriage 5 moving can be detected.

While the carriage 5 reciprocates in the main scanning direction, the head 15 discharges ink droplets of appropriate color toward the medium 16 at an appropriate timing, to form an image on the medium 16.

The medium 16 is sent from a sheet feeding unit to the medium conveyance unit by a sheet feeding motor. Further, in the medium conveyance unit, the sheet feeding motor drives conveyance rollers to convey the medium 16 to the platen 22 in the sub-scanning direction orthogonal to the main scanning direction. The sub-scanning direction is indicated by arrow B in FIGS. 1A and 1B.

FIG. 1B illustrates, as another example of the inkjet recording unit, a line-head inkjet recording unit 101.

In the example illustrated in FIG. 1B, the inkjet recording unit 101 includes a head 15a (another example of the liquid discharge head), a drive control board 18, a flat cable 19, and an adjuster plate 20, which are main components of the inkjet recording unit 101.

The drive control board 18 is a rigid board including a circuit constituting a control block 150 (see FIG. 5) and a circuit to generating an image data signal. The control block 150 is configured to generate a drive waveform for driving a piezoelectric element of the head 15a. The flat cable 19 electrically connects the drive control board 18 and the head 15a. The adjuster plate 20 secures a plurality of heads 15a with high accuracy. The drive control board 18 of the serial-head inkjet recording unit 100 illustrated in FIG. 1A has similar functions.

Similar to the head 15, the head 15a incorporates a piezoelectric element, drives the piezoelectric element based on the drive waveform and the image data signal transmitted from the drive control board 18, and discharges the liquid ink to the medium 16.

The inkjet recording unit 101 is of line-head type in which the heads 15a are arranged to cover the entire printing width, and color printing is performed by line heads of black, cyan, magenta, and yellow. The face of the nozzle plate (hereinafter "nozzle plate face 29", illustrated in FIG. 3) of each line head is supported with a gap kept from the medium 16 to the nozzle plate face 29. The inkjet recording unit 101 discharges liquid ink in accordance with the speed of conveyance of the medium 16, thereby forming a color image on the medium 16.

The following description is on the assumption that the serial-head inkjet recording unit 100 illustrated in FIG. 1A is used. Note that aspects of the present disclosure are applicable to a line-head liquid discharge device similarly.

Liquid Discharge Head

Figure 2:
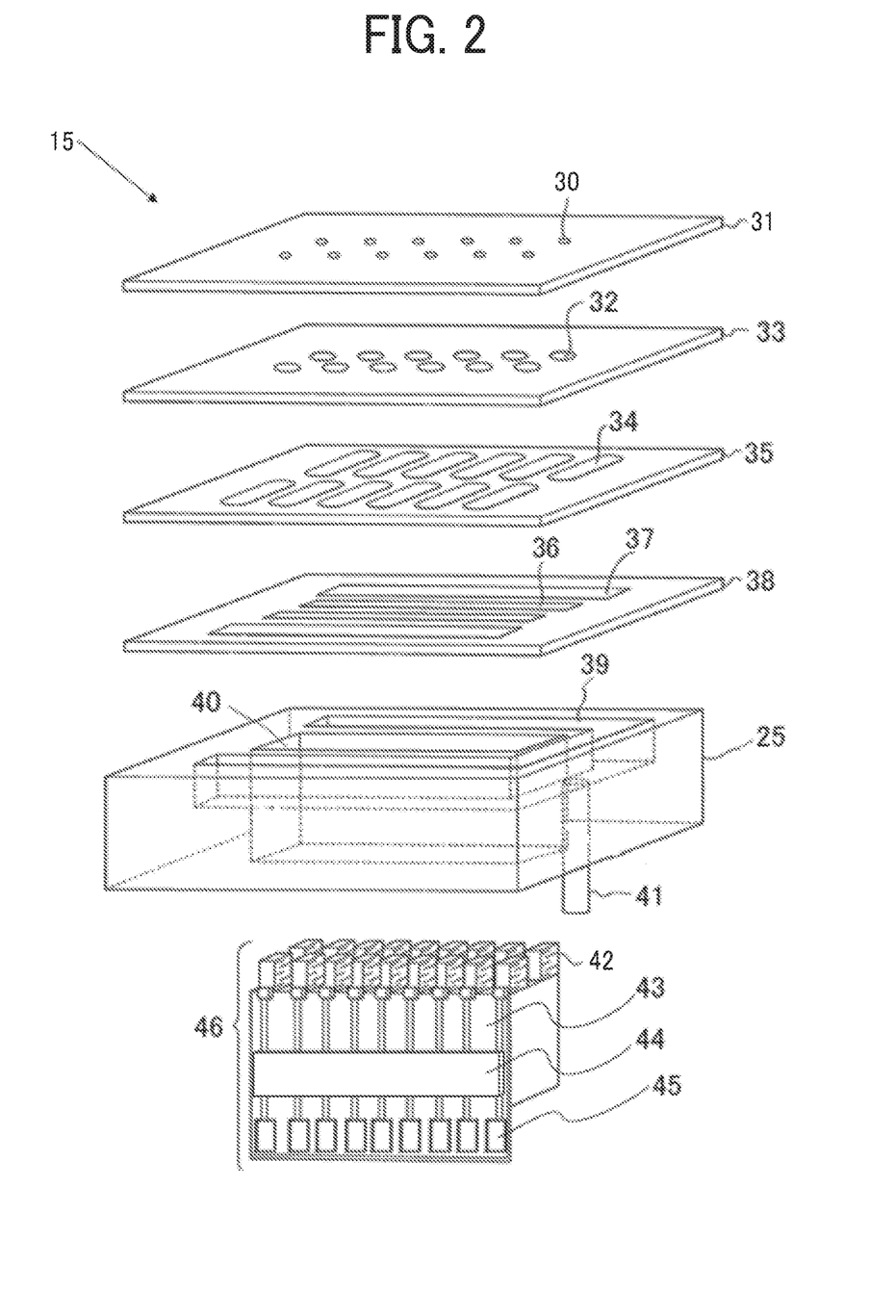
FIG. 2 is an exploded perspective view illustrating a configuration of a liquid discharge head according to an embodiment.

Next, an example configuration of the liquid discharge head of the liquid discharge device according to the present disclosure will be described with reference to FIG. 2. FIG. 2 is an exploded perspective view illustrating the configuration of the head 15 as the liquid discharge head. As illustrated in FIG. 2, the head 15 includes a nozzle plate 31, a pressure chamber plate 33, a restrictor plate 35, a diaphragm plate 38, a rigid plate 25, and a piezoelectric element group 46 which is a group of piezoelectric elements (a plurality of discharge elements).

The nozzle plate 31, the pressure chamber plate 33, the restrictor plate 35, and the diaphragm plate 38 are sequentially positioned and stacked one on another and joined together into a channel substrate that defines an ink flow channel.

A large number of nozzles 30 are formed in the nozzle plate 31. The nozzles 30 are arranged in a staggered manner in the surface direction of the nozzle plate 31. In the pressure chamber plate 33, individual pressure chambers 32, which are liquid chambers, are formed corresponding to the nozzles 30. In the restrictor plate 35, restrictors 34 are formed. The restrictors 34 communicate with a common ink channel 39 and the individual pressure chambers 32 and control the flow rate of ink to the individual pressure chambers 32. The diaphragm plate 38 includes diaphragms 36 and a filter 37.

The channel substrate having the above-described configuration is joined to the rigid plate 25, and the filter 37 is opposed to the opening of the common ink channel 39. The upper open end of the ink introduction pipe 41 is coupled to the common ink channel 39 of the rigid plate 25, and the lower open end of the ink introduction pipe 41 is coupled to an ink tank filled with ink.

A piezoelectric element drive integrated circuit (IC) 44 is mounted on a piezoelectric element supporting board 43. An electrode pad 45 which is a piezoelectric pad is coupled to the piezoelectric element drive IC 44. The drive voltage generated in the piezoelectric element drive IC 44 is applied to piezoelectric elements 42 via the electrode pad 45. The piezoelectric elements 42 are supported on the piezoelectric element supporting board 43.

The piezoelectric element drive IC 44 generates a drive voltage according to a drive signal supplied from a head drive control circuit connected to the head 15 and applies the drive voltage to the piezoelectric elements 42. The drive voltage generated by the piezoelectric element drive IC 44 varies based on the drive signal. Therefore, the potential of the drive voltage varies based on the drive signal. The variable drive voltage is applied to the piezoelectric elements 42 as a drive signal. The piezoelectric elements 42 deform according to the drive waveform. The deformation of the piezoelectric elements 42 generates pressure applied to the ink channel. The pressure is transmitted to the individual pressure chambers 32. From the pressurized individual pressure chambers 32, the ink is discharged as droplets via the nozzles 30. That is, the liquid ink is discharge in accordance with the drive signal.

Figure 3:
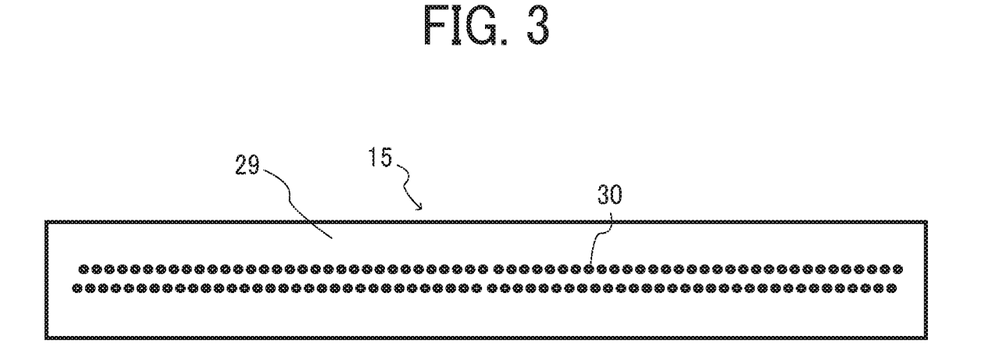
FIG. 3 is a schematic view of a recording head included in the liquid discharge head illustrated in FIG. 2.

With reference to FIG. 3, a discharge port for ink from the head 15 will be further described. FIG. 3 is a plan view of the nozzles 30 of the head 15, as viewed from the ink discharge port side. As illustrated in FIG. 3, the openings of the nozzles 30 serving as the ink discharge ports are arranged in a staggered manner on the nozzle plate face 29, which is the bottom face of the head 15. Arranging the large number of nozzles 30 in the staggered manner is advantageous in enhancing the resolution in image formation.

Drive Waveform Examples

The drive waveform applied to the head 15 will be described with reference to the drawings. FIGS. 4A to 4E illustrates examples of drive waveform and waveform of micro vibrating pulse used to discharge ink droplets of three sizes of large, medium, and small sizes.

For example, pulse is switched based on a control table corresponding to image data representing an image to be formed with ink discharge onto a recording medium. With the pulse selected in the switching, the piezoelectric elements 42 is operated, and ink droplets are discharged from the head 15. A switching circuit to performs the switching is disposed between the piezoelectric element drive IC 44 and the piezoelectric elements 42. The switching circuit switches the drive waveform (a pulse pattern) to one of the drive waveforms generated by the piezoelectric element drive IC 44.

Figure 4A:
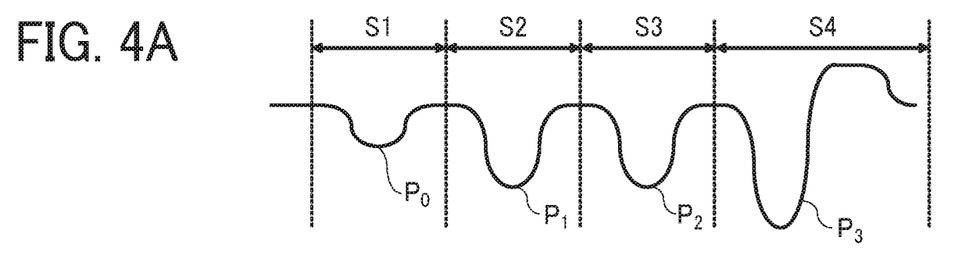
FIGS. 4A to 4E are diagrams illustrating example waveforms of drive signal applied to piezoelectric elements included in the recording head illustrated in FIG. 3.

As illustrated in FIG. 4A, the drive waveforms applied from the piezoelectric element drive IC 44 to the piezoelectric elements 42 include a plurality of patterns such as a micro vibrating pulse $P_0$, a first drive pulse $P_1$, a second drive pulse $P_2$, and a third drive pulse $P_3$.

Figure 4B:
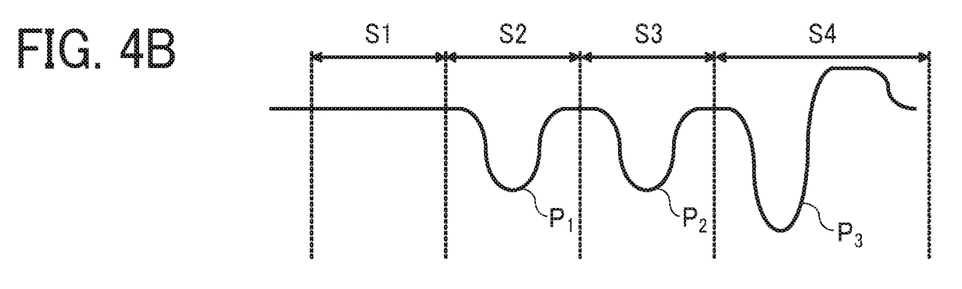

In the case of image formation with a large size dot (an ink droplet), the printing data given to the switch circuit in time periods S2, S3, and S4 is set to "1", and printing data given to the switch circuit in time S1 is set to "0". Then, as illustrated in FIG. 4B, the first drive pulse $P_1$, the second drive pulse $P_2$, and the third drive pulse $P_3$ are supplied to the piezoelectric element 42 to print a large size dot.

Figure 4C:
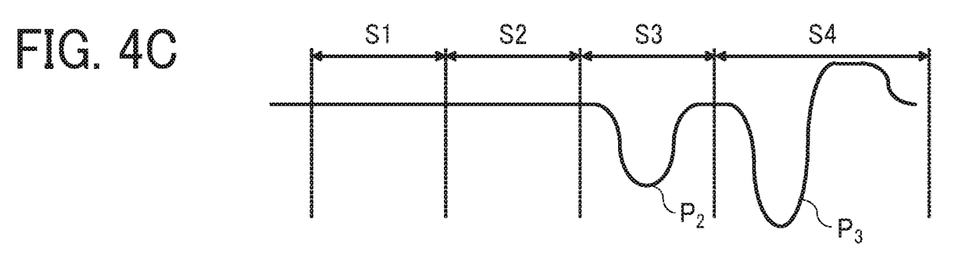

In the case of printing with a medium size dot, the printing data given to the switch circuit in times S3 and S4 is set to "1", and the printing data given to the switch circuit in times S1 and S2 is set to "0". As a result, as illustrated in FIG. 4C, the second drive pulse $P_2$ and the third drive pulse $P_3$ are supplied to the piezoelectric element 42 so that a medium size dot is discharged.

Figure 4D:
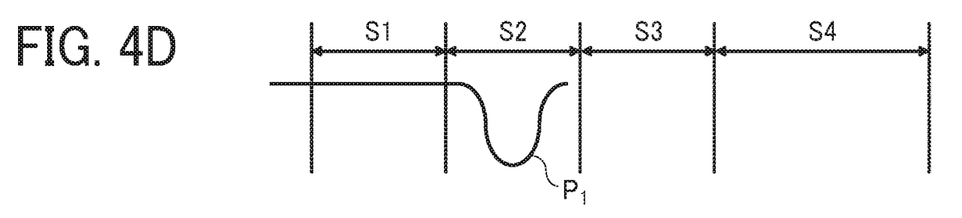

Further, In the case of printing with a small size dot, the printing data given to the switch circuit in time S2 is set to "1", and the printing data given to the switch circuit in times S1, S3, and S4 is set to "0". As a result, as illustrated in FIG. 4D, the first drive pulse P1 is supplied to the piezoelectric element 42 so that the small size dot is discharged.

Figure 4E:
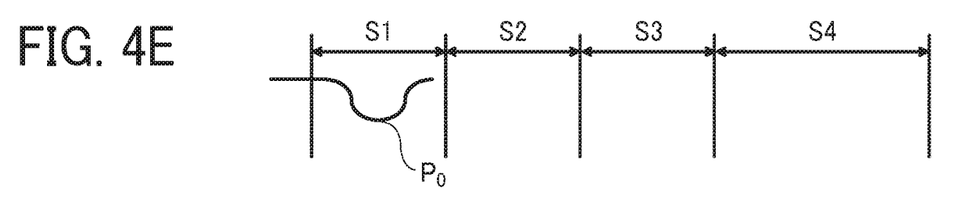

When only the print data in time S1 is set to "1", the micro vibrating pulse $P_0$ is supplied to the piezoelectric element 42 as illustrated in FIG. 4E. The micro vibrating pulse $P_0$ is for slightly vibrating the meniscus to the degree that ink is not discharged, thereby stirring the ink. Therefore, the micro vibrating pulse $P_0$ is smaller in pulse amplitude than other drive pulses (the first drive pulses $P_1$ to $P_3$), that is, the voltage level of the drive voltage is low.

Control Block

In order to control the discharging of liquid by the head 15, which is a liquid discharge head, a plurality of drive waveforms (pulse patterns) are selectively applied to the head 15 as described above. Therefore, in order to detect the abnormality of the drive waveform applied to the head 15, for example, the number of pulses is counted (pulse count method). Alternatively, the drive waveform is digitally converted, and the abnormality is detected from the voltage value of the digitalized drive waveform. However, in the pulse count method, an abnormal state is not determined until the comparison of expected count value is completed. In addition, in order to convert the voltage value of the drive waveform to a digital value, an analog-to-digital (A/D) converter is required, which is generally expensive. Therefore, such a configuration increases the manufacturing cost of the liquid discharging unit or degrades the response of abnormality detection in the head 15. By contrast, the control block 150 of the inkjet recording unit 101 including the head 15 can solve the above-mentioned inconvenience and effective. Details of the control block 150 will be described below.

Figure 5:
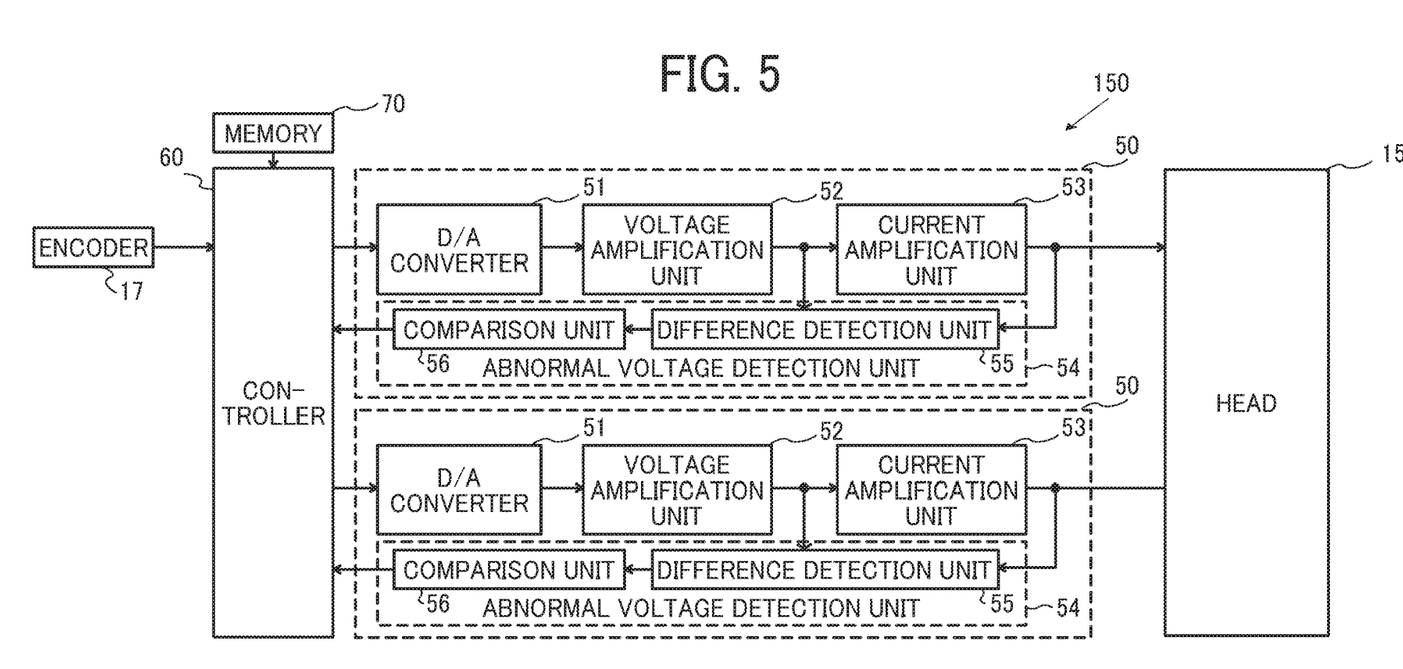
FIG. 5 is a block diagram illustrating a configuration of the liquid discharge device according to one embodiment.

FIG. 5 is a block diagram illustrating an example configuration of the control block 150 of the inkjet recording unit 101. The control block 150 includes a controller 60, a memory 70, drive waveform generation units 50, and the head 15. The drive waveform generation unit 50 is a drive circuit to drive the head 15 and includes a digital-to-analog (D/A) converter 51, a voltage amplification unit 52, a current amplification unit 53, and an abnormal voltage detection unit 54.

The drive waveform generation unit 50 is provided for each unit of outputting the drive waveform. In the example illustrated in FIG. 5, two drive circuits are provided for the head 15. Controlled by the controller 60, the drive waveform generation unit 50 stops operating when the controller 60 determines abnormality based on the signal output from the abnormal voltage detection unit 54 of that drive waveform generation unit 50. As illustrated in FIG. 5, in the case of the control block 150 including the two drive waveform generation units 50, only the operation of the drive waveform generation unit 50 determined to be abnormal is stopped.

The controller 60 controls drive waveform data indicating the shape of the drive waveform, discharge timing signals, and print data indicating the size of ink droplet from each nozzle 30. The drive waveform data is selected matrix-wise according to the temperature of ink and the characteristics of the head.

The discharge timing signal is generated as the encoder 17 transmits, to the controller 60, an encoder pulse signal corresponding to the position of the recording medium being conveyed and the controller 60 synchronizes the discharge timing with the encoder 17 based on the encoder pulse signal.

The controller 60 once stores the drive waveform voltage data in the memory 70, which is a waveform data memory, and extracts the drive waveform data from the memory 70 in response to a reception of the discharge timing signal. The controller 60 multiplies the extracted drive waveform data by a correction magnification and then outputs the corrected drive waveform data to the D/A converter 51 of the drive waveform generation unit 50. In addition, the controller 60 controls (e.g., stops the operation) the inkjet recording unit 101 based on an output from the abnormal voltage detection unit 54 (a detection result indicating the operation state of the drive waveform generation unit 50).

The D/A converter 51 converts the corrected drive waveform data into an analog signal and outputs the analog signal (drive waveform voltage signal) to the voltage amplification unit 52.

The voltage amplification unit 52 amplifies the input analog voltage and outputs the amplified voltage to the current amplification unit 53.

The current amplification unit 53 performs current amplification of the amplified analog signal and outputs the amplified signal to the head 15 as a drive waveform.

According to the drive waveform, the head 15 generates a drive waveform based on the print data and drives the piezoelectric element 42 as described above with reference to FIGS. 4A to 4E.

The abnormal voltage detection unit 54 of the drive waveform generation unit 50 includes a difference detection unit 55 and a comparison unit 56. The difference detection unit 55 extracts the difference between the output from the voltage amplification unit 52 and the output from the current amplification unit 53 and outputs the difference to the comparison unit 56. That is, the abnormal voltage detection unit 54 serves as an abnormality detection unit configured to monitor the state of the drive waveform output from the drive waveform generation unit 50, based on the output from the voltage amplification unit 52 and the output from the current amplification unit 53, and detect the abnormality of the drive waveform.

The comparison unit 56 compares the input from the difference detection unit 55 with a reference voltage. In response to the result of the comparison, the comparison unit 56 outputs a binarized signal of "High" or "Low". The output (binary information) is input to the controller 60. The controller 60 can detect whether or not an abnormality has occurred in the head 15 based on the binary information from the comparison unit 56.

When the output from the abnormal voltage detection unit 54 to the controller 60 indicates an abnormal state, the controller 60 can stop the operation of the drive waveform generation unit 50. To stop the operation, for example, the main power supply to supply power to the drive waveform generation unit 50 is stopped or the operation of the D/A converter 51 is stopped.

Alternatively, since the output from the abnormal voltage detection unit 54 is binarized by the comparison unit 56, the drive circuit can be stopped not only by the controller 60 but also by a circuit configuration, with an input from the abnormal voltage detection unit 54. In this case, the drive circuit can be stopped even when the controller 60 has a malfunction.

Abnormal Voltage Detection Unit

Figure 6:
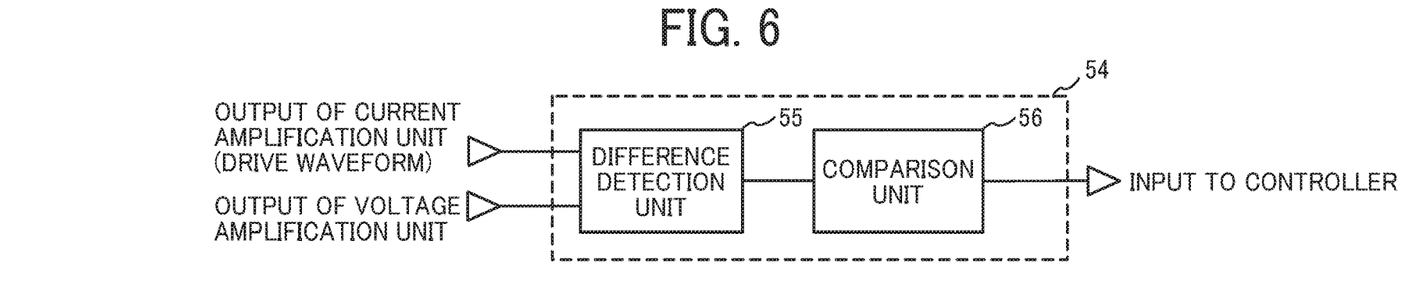
FIG. 6 is a block diagram illustrating an example of an abnormal voltage detection unit of the liquid discharge device according to an embodiment.

A first example of the abnormal voltage detection unit 54 will be described in detail with reference to FIG. 6. As illustrated in FIG. 6, the abnormal voltage detection unit 54 according to the present embodiment is a combination of the difference detection unit 55 and the comparison unit 56. The difference detection unit 55 can be implemented by a voltage differential amplification circuit, and the comparison unit 56 can be implemented by a voltage amplification comparator (a comparison circuit).

The difference detection unit 55 takes the voltage level difference between the output signal from the voltage amplification unit 52 and the output signal (drive waveform) from the current amplification unit 53 and outputs a voltage multiplied by a voltage gain. When the voltage input from the difference detection unit 55 exceeds the reference voltage, the comparison unit 56 outputs a high signal to the controller 60. When the input voltage does not exceed the reference voltage, the comparison unit 56 outputs a low signal to the controller 60. When the high signal is input from the abnormal voltage detection unit 54, the controller 60 determines that the state is abnormal. Therefore, when the difference between the output from the voltage amplification unit 52 and the output from the current amplification unit 53 exceeds the threshold, the controller 60 can detect the abnormality of the drive waveform generation unit 50.

Thus, the abnormal voltage detection unit 54 can have a simple configuration with an operational amplifier, a comparator, and the like and inexpensive compared with a configuration using an A/D converter or the like. Thus, an abnormality in the drive waveform generation unit 50 can be detected with a simple configuration.

Waveform at Voltage Abnormality

Figure 7A:
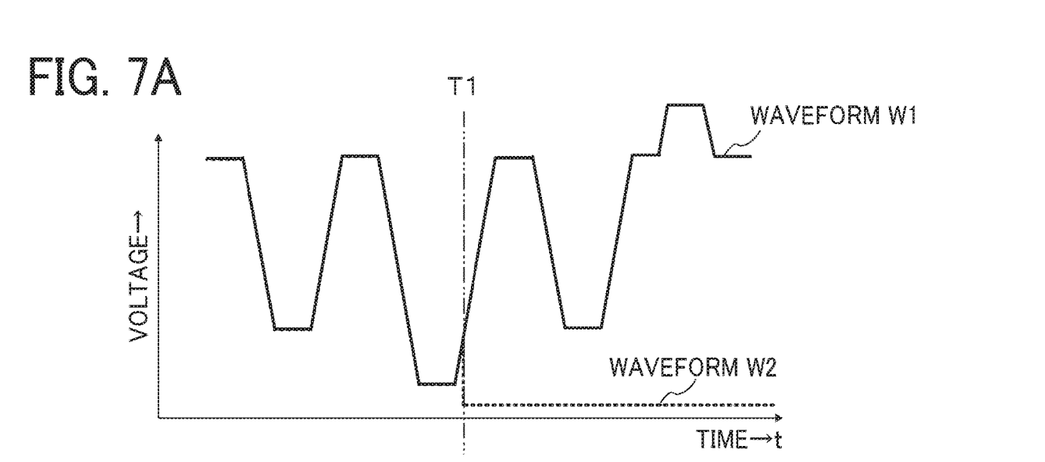
FIGS. 7A to 7C are graphs illustrating examples of relation between waveforms output from the abnormal voltage detection unit and detection of an abnormal state.

Descriptions are given below of the relation between the output waveform from the abnormal voltage detection unit 54 and the detection of the abnormal state, with reference to FIGS. 7A, 7B, and 7C. A waveform W1 illustrated in FIG. 7A represents an output from the voltage amplification unit 52, and a waveform W2 represents an output from the current amplification unit 53. It is assumed that a signal circuit to output the drive waveform is short-circuited at a time T1. At this time, the voltage level of the waveform W2 representing the output from the current amplification unit 53 is close to ground (GND). In this case, the voltage difference between the waveforms W1 and W2 is large. The voltage difference depends on the drive waveform.

Figure 7B:
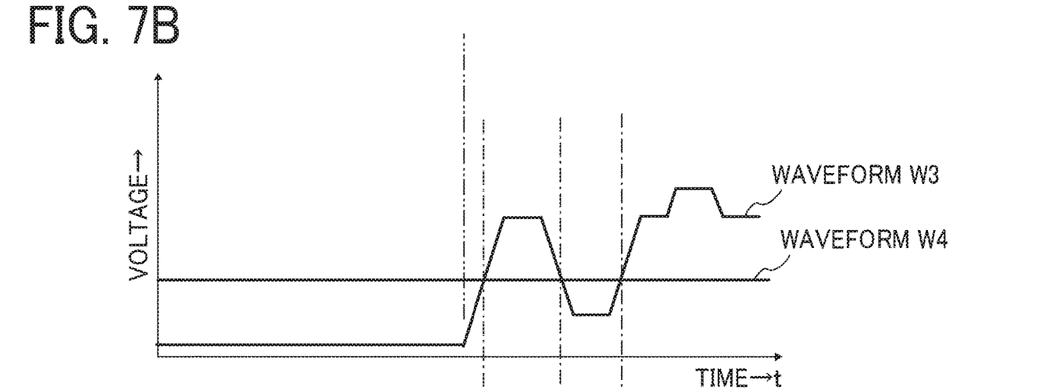
Figure 7C:
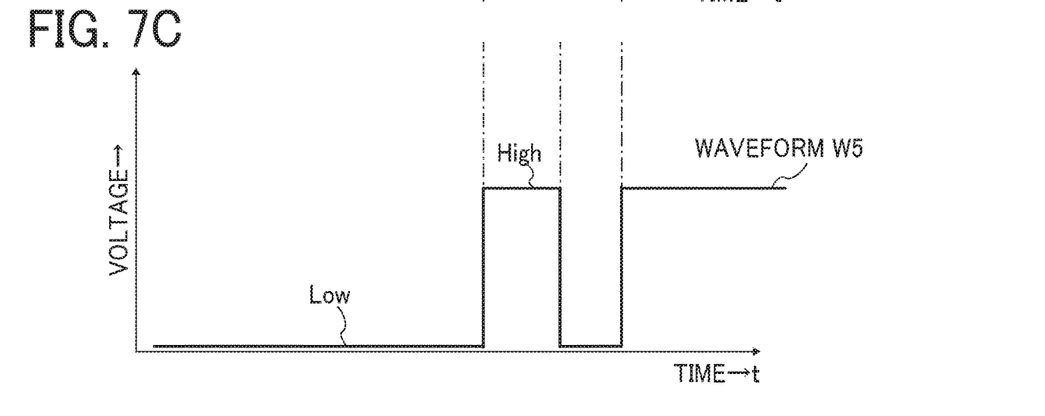

When the voltage level difference between the waveforms W1 and W2 is extracted, a waveform W3 illustrated in FIG. 7B is obtained. The waveform W3 represents the output from the difference detection unit 55. A waveform W4 in FIG. 7B represents the reference voltage. Then, when the voltage level of the waveform W3 is larger than the waveform W4 (reference voltage, that is, a threshold) as illustrated in FIG. 7B, the comparison unit 56 outputs a signal like a waveform W5 illustrated in FIG. 7C. The controller 60 can monitor the waveform W5 to determine whether or not the state of the drive waveform generation unit 50 is abnormal.

Figure 8:
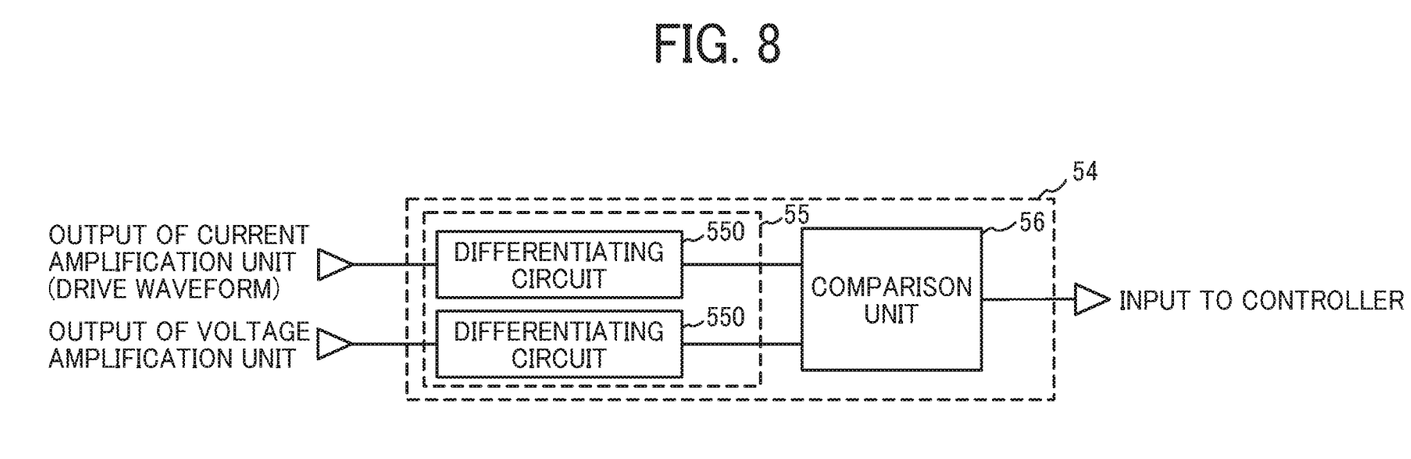
FIG. 8 is a block diagram illustrating an abnormal voltage detection unit according to another embodiment.

Next, descriptions are given below of a second example of the abnormal voltage detection unit 54 with reference to FIG. 8. The abnormal voltage detection unit 54 illustrated in FIG. 8 is constituted of a combination of the difference detection unit 55 and the comparison unit 56. The difference detection unit 55 can be implemented by differentiating circuits, and the comparison unit 56 can be implemented by a voltage comparison circuit.

The difference detection unit 55 includes two differentiating circuits 550 so as to differentiate the output signal from the voltage amplification unit 52 and the output signal (drive waveform) from the current amplification unit 53. Each differentiating circuit 550 outputs a signal indicating the slope of the input (voltage waveform) thereto. The comparison unit 56 outputs the difference between "slopes" output from the differentiating circuits 550. When there is a difference in "slopes", the comparison unit 56 outputs a high signal to the controller 60. When there is no difference in "slopes", the comparison unit 56 outputs a low signal to the controller 60. When the high signal is input from the abnormal voltage detection unit 54 (the comparison unit 56), the controller 60 determines the abnormal state. Therefore, when there is a "slope" difference between the output from the voltage amplification unit 52 and the output from the current amplification unit 53, the controller 60 can detect the abnormality of the drive waveform generation unit 50.

According to the second example, similar to the first example, the abnormal voltage detection unit 54 can have a simple configuration with a resistor, a capacitor, an operational amplifier, a comparator, and the like and inexpensive compared with a configuration using an A/D converter or the like. Thus, an abnormality in the drive waveform generation unit 50 can be detected with a simple configuration.

Second Example of Drive Waveform at Voltage Abnormality

Figure 9A:
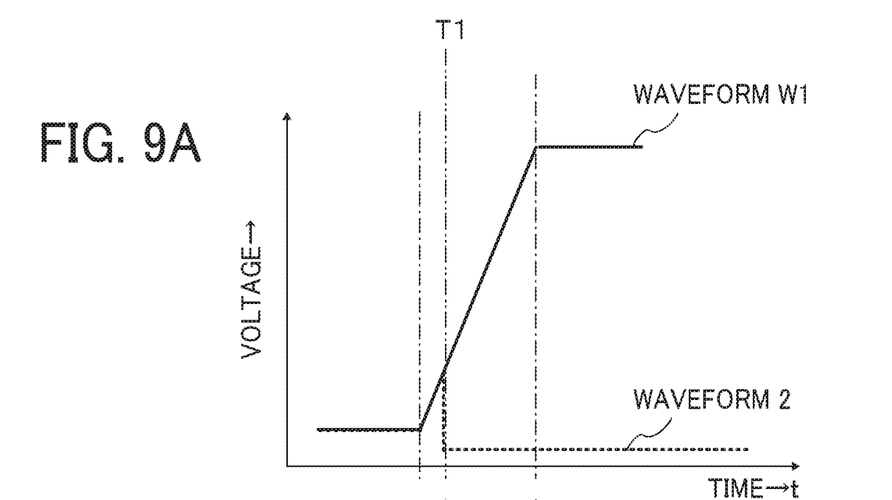
FIGS. 9A to 9C are graphs illustrating another example of relation between waveforms output from the abnormal voltage detection unit and detection of an abnormal state.

Descriptions are given below of the relation between the "slope" of the waveform output from the abnormal voltage detection unit 54 and the detection of the abnormal state, with reference to FIGS. 9A, 9B, and 9C. The waveform W1 illustrated in FIG. 9A represents an output from the voltage amplification unit 52, and the waveform W2 represents an output from the current amplification unit 53. It is assumed that a signal circuit to output the drive waveform is short-circuited at a time T1. At this time, the voltage level of the waveform W2 representing the output from the current amplification unit 53 is close to ground (GND). In this case, the signal shape is different between the waveforms W1 and W2.

Figure 9B:
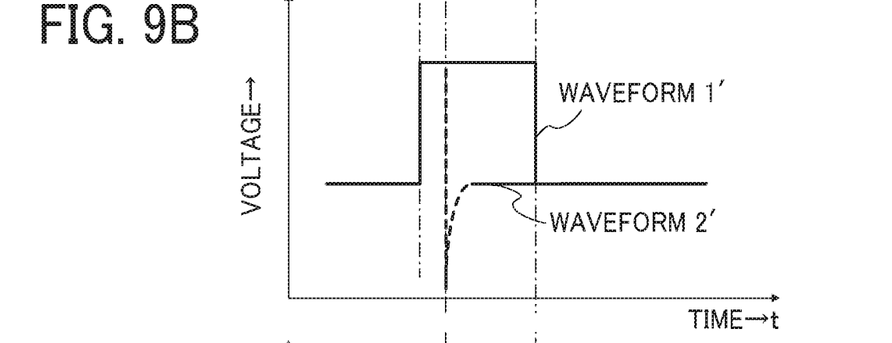

In FIG. 9B, the waveform differentiated from the waveform W1 is illustrated as a waveform W1', and the waveform differentiated from the waveform W2 is illustrated as a waveform W2'. As illustrated in FIG. 9B, the waveform W1' and the waveform W2' are completely different in shape.

Figure 9C:
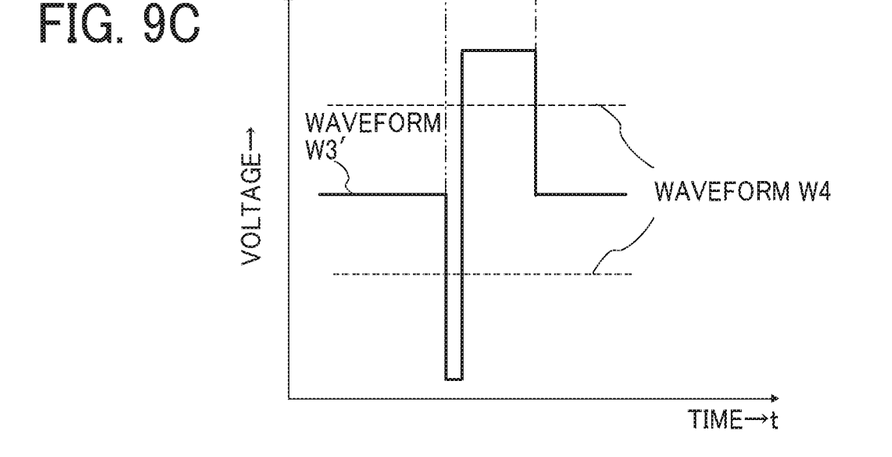

When the difference between the waveforms W1' and W2' (the slope difference between the waveforms W1 and W2) is extracted, the waveform W3' illustrated in FIG. 9C is obtained. The waveform W3' is compared with the waveform W4, which is the reference voltage, as illustrated in FIG. 9C. The waveform W4' represents the upper limit and the lower limit of a predetermined signal level width. When the waveform W3' exceeds the upper limit or the lower limit of the waveform W4', the comparison unit 56 outputs a high signal. When the waveform W3' does not exceed the upper limit and the lower limit of the waveform W4', the comparison unit 56 outputs a low signal. As a result, the controller 60 can monitor whether or not the state of the drive waveform generation unit 50 is abnormal.

As described above, in comparison between the output from the current amplification unit 53 and the output from the voltage amplification unit 52, the comparison unit 56 compares the slope of output from the current amplification unit 53 and the slope of output from the voltage amplification unit 52. Accordingly, the response is faster compared with the first example in which the size of difference is used in abnormality detection. In addition, the detection speed at the occurrence of abnormality can be faster compared with the first example in which the voltage difference is compared with the reference.

Descriptions are given below of a third example of the abnormal voltage detection unit 54 with reference to FIGS. 10A and 10B.

Figure 10A:
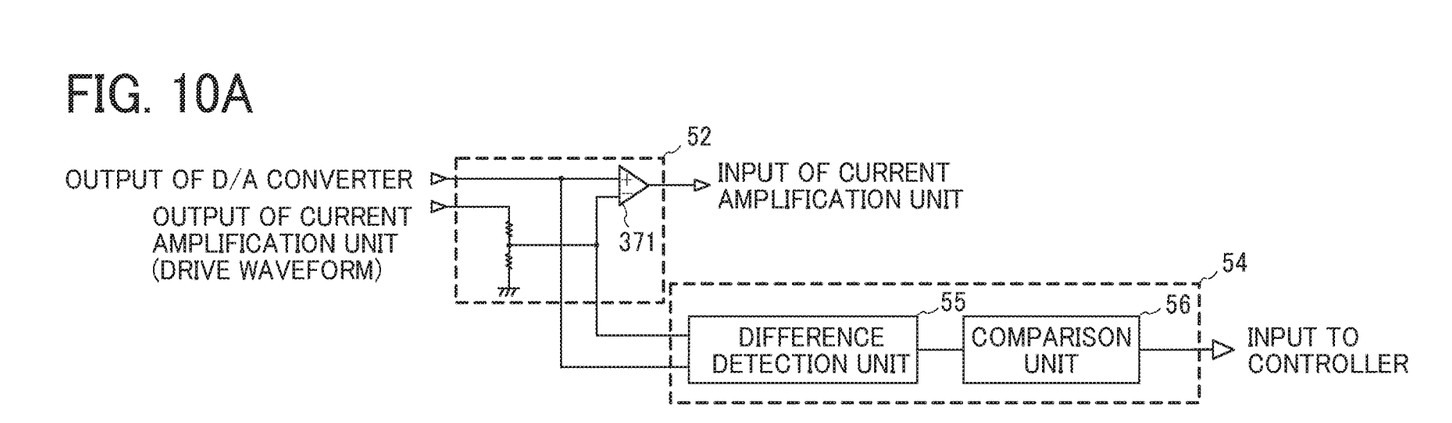
FIGS. 10A and 10B are block diagrams illustrating an abnormal voltage detection unit according to yet another embodiment.
Figure 10B:
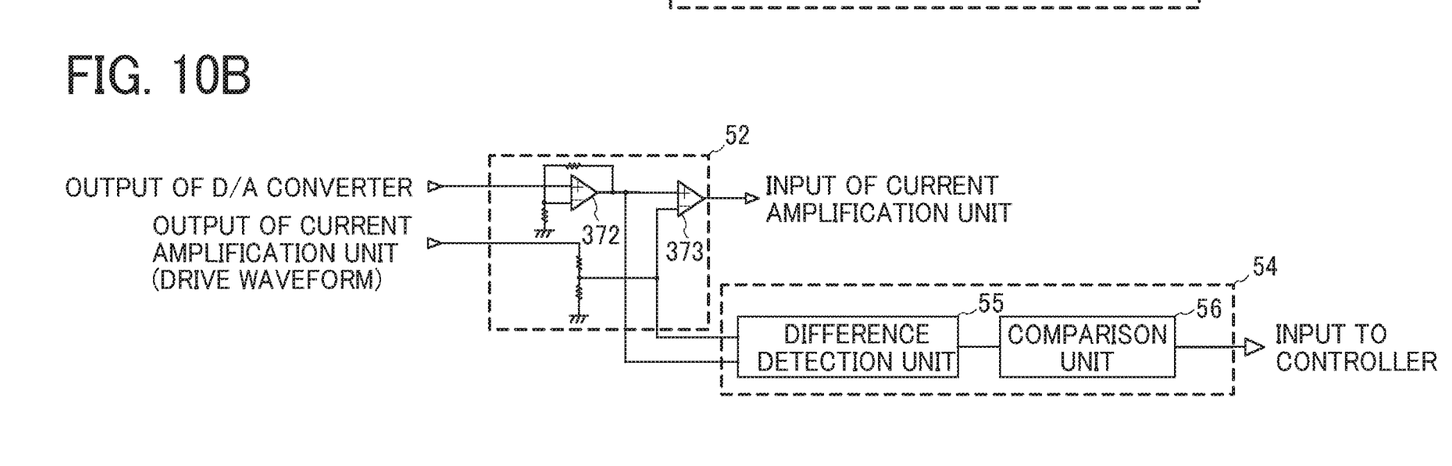

The abnormal voltage detection unit 54 illustrated in FIGS. 10A and 10B has almost the same configuration as the above-described described first example (see FIG. 6) and the second example (see FIG. 8) but is different in the configuration regarding input from the voltage amplification unit 52 to the abnormal voltage detection unit 54 in the drive waveform generation unit 50. As illustrated in FIGS. 10A and 10B, in the drive waveform generation unit 50 according to the present example, the difference detection unit 55 constituting the abnormal voltage detection unit 54 receives an input signal only from the voltage amplification unit 52.

In the voltage amplification unit 52 illustrated in FIG. 10A, the voltage is amplified mainly in an operational amplifier 371. The voltage amplification unit 52 divides the voltage from the current amplification unit 53 to improve the frequency characteristic and inputs a feedback signal to the operational amplifier 371 that is for amplification.

In the example illustrated in FIG. 10A, the signal from the D/A converter 51 is the same in voltage level as the feedback signal. Therefore, such a signal can be used as an input to the difference detection unit 55. Accordingly, the voltage level of the input signal to the difference detection unit 55 decreases, and level of resistance to voltage required for an integrated circuit (IC) used in the circuit can decrease. As a result, the cost of components of the abnormal voltage detection unit 54 can be reduced.

In the example illustrated in FIG. 10B, a plurality of operational amplifiers 372 and 373 amplifies the voltage in the voltage amplification unit 52. In this configuration, the input signal to the operational amplifier 373 to which the feedback signal is input is used as the input signal to the difference detection unit 55. Accordingly, the voltage level of the input signal to the difference detection unit 55 decreases, and level of resistance to voltage required for an integrated circuit (IC) used in the circuit can decrease. As a result, the cost of components of the abnormal voltage detection unit 54 can be reduced.

The configuration described above with reference to FIGS. 10A and 10B can adapt to the abnormal voltage detection unit 54 illustrated in FIG. 6 that detects abnormality based on the voltage level difference or the abnormal voltage detection unit 54 illustrated in FIG. 8 that detects abnormality based on the voltage slope difference.

Operation Flow

Figure 11:
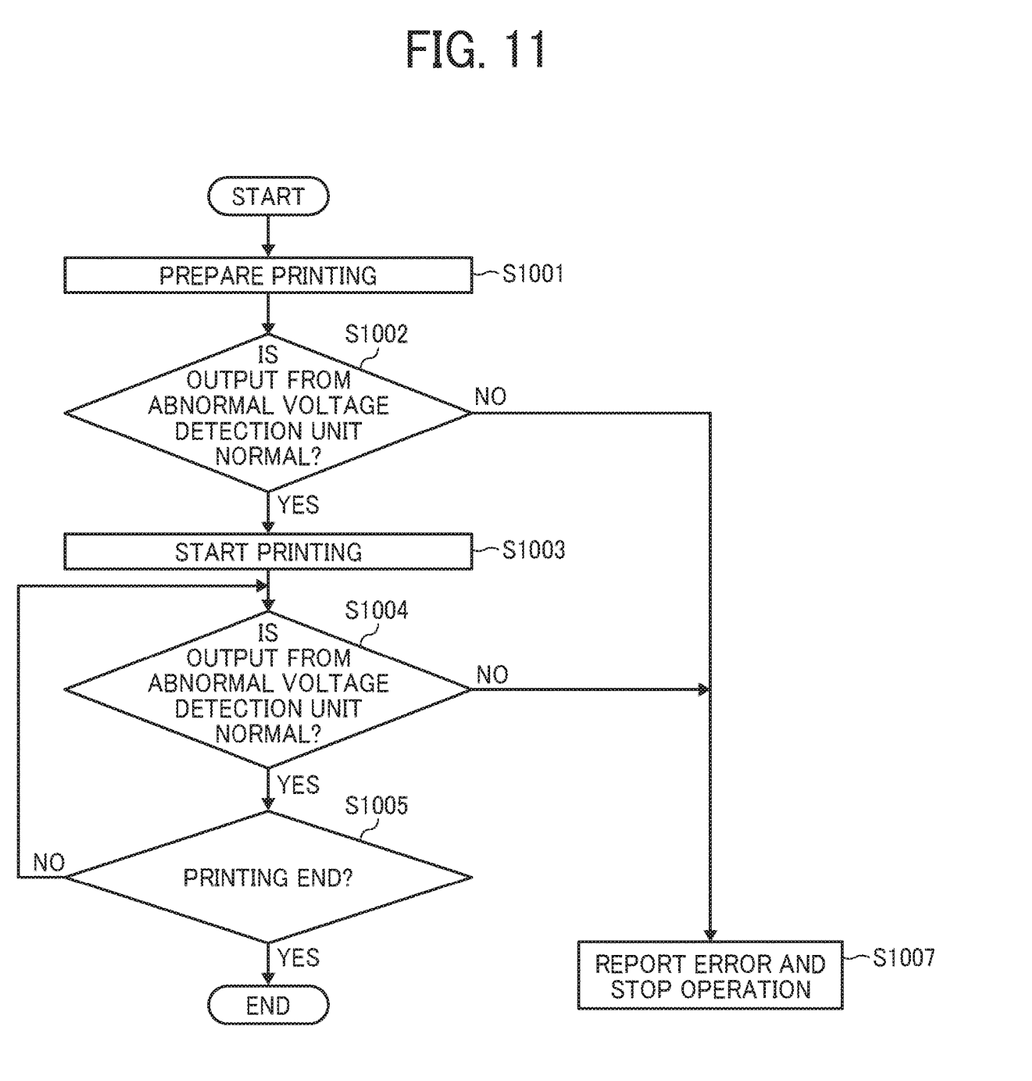
FIG. 11 is a flowchart illustrating an example of abnormality detection processing executed in a liquid discharge apparatus according to an embodiment.

Descriptions are given below of the flow of abnormality detection executed in the inkjet recording apparatus according to the present embodiment, with reference to FIG. 11.

As the inkjet recording unit 100 is driven to start printing preparation (S1001), the controller 60 starts constant monitoring of the output from the difference detection unit 55 and determines whether the output from the abnormal voltage detection unit 54 is normal (S1002).

In response to a determination that the output from the abnormal voltage detection unit 54 indicates abnormality (No in S1002), the controller 60 reports an error and stops the operation of the inkjet recording unit 100 (S1007). In response to a determination that the output from the abnormal voltage detection unit 54 indicates a normal state (Yes in S1002), the the controller 60 starts printing operation (S1003).

After starting the printing operation, the controller 60 continues constant monitoring of the output from the difference detection unit 55 (S1004).

In response to a determination that the output from the abnormal voltage detection unit 54 indicates abnormality (No in S1004), the controller 60 reports an error and stops the operation of the inkjet recording unit 100 (S1007). In response to a determination that the output from the abnormal voltage detection unit 54 indicates a normal state (Yes in S1004), the the controller 60 continues printing to completion of the printing (Yes in S1005).

When the printing is completed (Yes in S1005), the controller 60 stops the operation of the inkjet recording unit 100.

In the configuration in which the head 15 includes a plurality of nozzle rows as described above with reference to FIG. 3, the head 15 can include a plurality of tanks ink containing different color inks respectively for the plurality of nozzle rows. In a configuration in which the inkjet recording unit 100 includes a plurality of nozzle rows for discharging same color ink, when the output from the difference detection unit 55 indicates abnormality, only the target drive circuit can is stopped and the printing can be complemented by other nozzle rows of the same color ink, without stopping the printing. As a result, the down time of the apparatus can be reduced.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A liquid discharge device comprising:
    a liquid discharge head configured to discharge liquid; and
    circuitry configured to:
        generate a drive waveform to drive the liquid discharge head;
        convert, to an analog signal, drive waveform voltage data being a source of the drive waveform;
        amplify, with a voltage amplifier, the analog signal to generate a drive waveform voltage signal corresponding to the drive waveform voltage data;
        amplify, with a current amplifier, the drive waveform voltage signal to generate the drive waveform;
        monitor the drive waveform to detect an abnormality of the drive waveform;
        control an operation of the liquid discharge device based on a result of detection of the abnormality of the drive waveform;
        compare an output of the voltage amplifier and an output of the current amplifier to output a difference between the output of the voltage amplifier and the output of the current amplifier; and
        output a binarized signal based on the difference.

2. The liquid discharge device according to claim 1, wherein the circuitry is configured to output the difference based on a result of comparison of voltage level between the output of the voltage amplifier and the output of the current amplifier.

3. The liquid discharge device according to claim 1, wherein the circuitry is configured to:
    differentiate the output of the current amplifier and the output of the voltage amplifier; and
    output the difference based on a result of comparison of the differentiated output of the current amplifier and the differentiated output of the voltage amplifier.

4. The liquid discharge device according to claim 1, wherein the circuitry includes a plurality of drive circuits each of which is configured to generate the drive waveform, and
    wherein the circuitry is configured to detect an abnormality of the drive waveform generated by each of the plurality of drive circuits.

5. The liquid discharge device according to claim 1, wherein the circuitry is configured to stop generation of the drive waveform in which the abnormality is detected based on comparison between the output of the voltage amplifier and the output of the current amplifier.

6. The liquid discharge device according to claim 1, further comprising:
    a waveform data memory configured to store the drive waveform voltage data; and
    a digital-to-analog converter configured to convert the drive waveform voltage data into an analog signal,
    wherein the analog signal output from the digital-to-analog converter is input to the voltage amplifier.

7. A liquid discharge apparatus comprising the liquid discharge device according to claim 1.

* * * * *